United States Patent
Best et al.

(10) Patent No.: US 9,454,426 B2
(45) Date of Patent: Sep. 27, 2016

(54) CODES OF LENGTH TN INVARIANT UNDER ROTATIONS OF ORDER N

(71) Applicant: International Business Machines Corporation, Armonk, NY (US)

(72) Inventors: John S. Best, San Jose, CA (US); Mario Blaum, San Jose, CA (US); Steven R. Hetzler, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 162 days.

(21) Appl. No.: 14/324,273

(22) Filed: Jul. 7, 2014

(65) Prior Publication Data

US 2016/0006457 A1   Jan. 7, 2016

(51) Int. Cl.

| | | |
|---|---|---|
| *H03M 13/11* | (2006.01) | |
| *H03M 13/00* | (2006.01) | |
| *G06F 11/10* | (2006.01) | |
| *H03M 13/03* | (2006.01) | |
| *H03M 13/13* | (2006.01) | |
| *H03M 13/29* | (2006.01) | |
| *H03M 13/19* | (2006.01) | |

(52) U.S. Cl.
CPC ........ *G06F 11/1004* (2013.01); *H03M 13/033* (2013.01); *H03M 13/13* (2013.01); *H03M 13/29* (2013.01); *H03M 13/136* (2013.01); *H03M 13/19* (2013.01)

(58) Field of Classification Search
CPC .................. H03M 13/1105; H03M 13/6566; H03M 13/033; H03M 13/29; H03M 13/136; H03M 13/19; H03M 13/13; G06F 11/1004
See application file for complete search history.

(56) References Cited

U.S. PATENT DOCUMENTS

| | | |
|---|---|---|
| 3,798,614 A | 3/1974 | Meadows et al. |
| 5,233,618 A | 8/1993 | Glider et al. |
| 5,563,897 A | 10/1996 | Pyndiah et al. |
| 7,155,634 B1 | 12/2006 | Le Graverand et al. |
| 2005/0117745 A1 | 6/2005 | Lee et al. |
| 2008/0075176 A1* | 3/2008 | Karr ................... H03M 13/1505 375/242 |

(Continued)

OTHER PUBLICATIONS

Blankenship et al., "Block Product Code Design With the Aid of Union Bounds," IP.com Prior Art Database, Dec. 11, 2006, 6 pages.

(Continued)

*Primary Examiner* — Albert Decady
*Assistant Examiner* — Kyle Vallecillo
(74) *Attorney, Agent, or Firm* — Cantor Colburn LLP; Yuhsuke Kanehira

(57) ABSTRACT

Embodiments include generating an error correction code by identifying two error-correcting codes of length n with minimum distances d and 2d, such that the second code is contained into the first code. Data is then encoded into t−1 blocks using the first code, and into the t-th block using the second block. The first t−1 encoded blocks are stored into t−1 blocks of memory locations, while the exclusive-OR (XOR) of such t−1 encoded blocks and the t-th encoded block is stored into a t-th block of memory location. The final encoded vector of length to is identified as belonging in a code with minimum distance 2d. Rotations of an encoded vector jn times are identified as belonging to the same equivalence class. A received vector or its rotations jn times can be successfully identified in the presence of up to d−1 errors, while d errors are identified as uncorrectable errors.

17 Claims, 3 Drawing Sheets

(56) References Cited

U.S. PATENT DOCUMENTS

2011/0141485 A1\* 6/2011 Lee .................. G06K 9/00664
356/614
2012/0117745 A1 5/2012 Hattori et al.

OTHER PUBLICATIONS

Blaum et al., "On Codes of Length tn and Minimum Distance 2d Invariant Under Rotations of order n", Sep. 28, 2012, IBM Almaden Research Center, San Jose, CA 95120; 10 pages.

Boisson et al., "Distance-driven motion estimation for side information extraction in distributed video coding," IP.com Prior Art Database, Mar. 18, 2008, 4 pages.

Nomura et al., "Proceedings of the Eighth International Symposium on Space Technology and Science," National Air and Space Museum Library, Tokyo, 1969, 9 pages.

Zhibin et al., "A Block Partitioning Vector Quantization Method Through Post-Processing to Achieve Higher PSNR," IEEE, 2002, pp. 644-647.

\* cited by examiner

US 9,454,426 B2

CODES OF LENGTH TN INVARIANT UNDER ROTATIONS OF ORDER N

BACKGROUND

The present disclosure relates generally to error detection and correction and more particularly to an error correction and detection technique using codes of a particular length and invariant under rotations of a certain size.

In digital technology, error detection and correction of errors is very important. In a world reliant on digital data it is critical to process as well as send and receive reliable information. Errors can occur due to a number of factors such as channel noise during the communication between devices. There are many ways to accomplish error detection and correction using so called error-correcting codes.

In some embodiments, data is read from a two dimensional array and it is not possible to distinguish between an upper and a lower part of the array when the data is read. Similarly, it may not be possible to distinguish between arrays that have been rotated 90 degrees, or even some other angle. A situation like this one occurs, for instance, when data is read using a camera but the exact angle of the camera cannot be determined.

A solution to this problem involves declaring equivalent arrays that have been rotated a predetermined angle or amount. However, the situation gets more complex in the presence of errors, a situation that is nearly always present in modern digital technology. For that reason, it is desirable to design a code that is both invariant under rotation and having error correcting and detecting properties that are tailored to the channel in question.

SUMMARY

Embodiments include methods and computer programs for generating an error correction code of length tn that is invariant under rotations of size n. This means, every time a vector in the code is rotated n locations, a new vector is obtained that represents the same data as the original vector. In addition, the code will tolerate a predetermined number of errors. When using a camera reading two dimensional data, rotating n locations a vector of length tn corresponds to rotating either the camera or the two dimensional data an angle of t/360 degrees. For example, if t=4, the rotated angle is 90 degrees. In one aspect, the method includes identifying at least two error-correcting codes having predetermined minimum distances such that the second code is contained in the first code, and the minimum distance of the second code is at least twice as large as the minimum distance of the first code. The two codes are combined using a variation of the well-known (u|u+v) construction and it is observed the invariance under rotations of length n, as well as a global error-correcting capability limited by the minimum distance of the second code.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION

Figure 1:
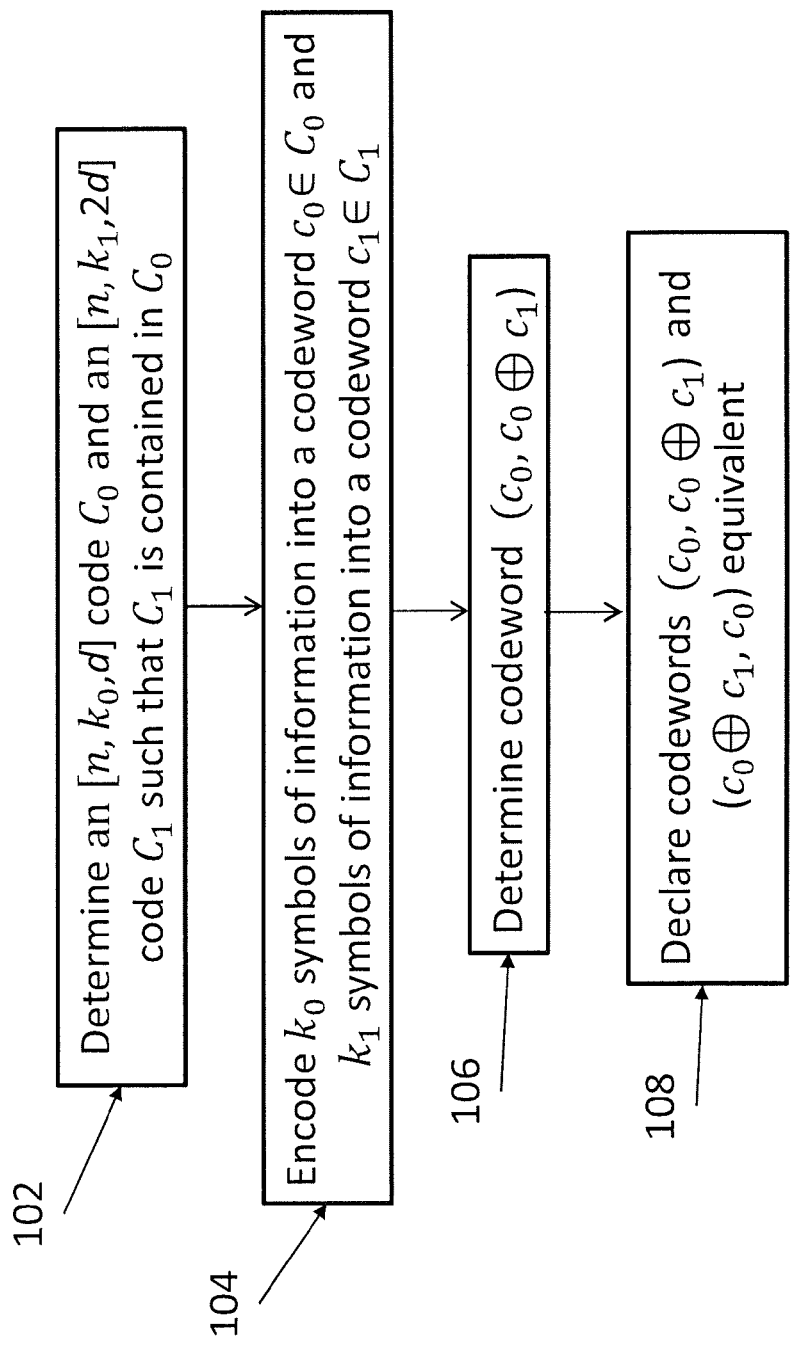
FIG. 1 depicts a flow chart diagram describing an error correction and detection in accordance with an exemplary embodiment.

FIG. 1 is a process flow process provided in accordance with one embodiment. The embodiment, depicts a technique for identifying a vector that can be read, such as by a camera, after a rotation of 180 degrees using codes of length 2n invariant under rotations of order n. In block 102, a first and a second code are determined. Both codes have length n, but the first code has minimum distance d and the second code has minimum distance 2d; moreover, the second code is contained in the first code. In block 104, a number of symbols are encoded using the first code and a second number of symbols are encoded using the second code. In block 106, both codewords are combined to form a codeword of length 2n. The first codeword is stored in a memory block of length n, while a second block, also of length n, stores the exclusive-OR (XOR) of both codewords. In block 108 it is established that codewords of length 2n and their rotations of order n are equivalent. The resulting code of length 2n has minimum distance 2d; hence, it can correct up to d−1 errors and detect d errors.

In one embodiment of the present invention, codes of length tn and minimum distance 2d that are invariant under a rotation of order n are constructed to achieve this purpose. The construction is based on the |u|u+v| construction. In this embodiment, a $[2^r; 2^r-r-1; 4]$ extended Hamming code invariant under rotations of order $2^{r-1}$ can be used. In addition, simple recursive encoding and decoding procedures are used. Applications to identification of bit patterns of length tn where rotations of n bits are undistinguishable from each other are provided.

Given an error-correcting code C, C is invariant under a permutation σ if, given any codeword c ∈ C, permuting the coordinates of c according to σ gives a vector c' that is also a codeword in C. The best known permutations are rotations (either to the right or to the left). A code that is invariant under a rotation is called a cyclic code. Cyclic codes of length n have a simple description in that their codewords, viewed as polynomials, are divisible by a fixed polynomial g(x), called the generator polynomial of the code, such that g(x) divides $x^n-1$. Although permuting the coordinates of a code gives an equivalent code from the point of view of the minimum distance, often some descriptions are more convenient than others. For example, cyclic codes are often preferable to their equivalent non-cyclic counterparts due to the simplicity of the encoding.

In one embodiment, linear codes of length tn and minimum distance 2d that are invariant under a rotation of order n are provided. In general, a code of length tn that is invariant under a rotation of order n is called a quasi-cyclic code. In particular, in this embodiment, we present a binary $[2^r, 2^r-r-1, 4]$ extended Hamming code, r≥2, that is invariant under a rotation of order $2^{r-1}$. If there was a cyclic extended Hamming code, the problem would be solved, since cyclic codes are invariant under any rotation and in particular, under a rotation of order $2^{r-1}$. However, there is no cyclic extended Hamming code, since, if there was, its generator polynomial would be a factor of $x^{2^r}-1$. However, in the binary field GF(2), the only factor of $x^{2^r}-1$ is $x-1$. Thus, the generator polynomial of any binary cyclic code of length $2^r$ is a power of $x-1$. These codes are all trivial and they do not correspond to an extended Hamming code when $r \geq 3$.

In one embodiment, a general construction of codes of length tn and minimum distance 2d that are invariant under rotations of order n is provided and explained. In particular, a binary code of length $2^r$, dimension $2^r-r-1$, minimum distance 4 and invariant under rotations of order $2^{r-1}$ is given as well as some applications for the new codes. It is well known that also product codes provide codes of length tn and minimum distance 2d, but their rate is worse than the one of the codes given in this invention.

For ease of discussion, several well-known concepts are going to be reviewed, such as the $|u|u+v|$ construction: Construction 2.1—(The $|u|u+v|$ construction) Let $C_0$ and $C_1$ be codes, not necessarily linear, of length n, number of codewords $M_0$ and $M_1$ and minimum distances $d_0$ and $d_1$ respectively. Then, code C consisting of all possible codewords $(\underline{u}, \underline{u}+\underline{v})$ for $u \in C_0$ and $v \in C_1$ is a code of length 2n, $M_0 M_1$ codewords and minimum distance $d=\min\{2d_0, d_1\}$. It is of particular interest the case in which the $|u|u+v|$ construction is repeated t times, both codes are assumed to be linear and $C_1 \subseteq C_0$, as will be shown in Construction 2.2. Construction 2.2—Let $C_0$ and $C_1$ be $[n, k_0, d]$ and $[n, k_1, 2d]$ linear codes respectively over a field $GF(2^m)$ such that $C_1 \subseteq C_0$. Let $C_{t,n}$ be the $[tn, (t-1)k_0+k_1]$ code consisting of all possible codewords $\underline{c}$ such that $$\underline{c} = \left(\underline{c}_0, \underline{c}_1, \ldots, \underline{c}_{t-2}, \bigoplus_{i=0}^{t-1} \underline{c}_i\right) \quad (1)$$

where $\underline{c}_i \in C_0$ for $0 \leq i \leq t-2$ and $\underline{c}_{0 \ldots 1} \in C_1$. Then C is a $[tn, (t-1) k_0+k_1, 2d]$ linear code.

It is clear that code $C_{t,n}$ has dimension $(t-1)k_0+k_1$ and minimum distance 2d by induction on t when the $|u|u+v|$ construction is applied repeatedly. It can also be proven that the code is invariant under rotations of order n.

Some examples are given next in order to make these concepts clearer. In a first example, let $C_0$ be the [4, 3, 2] even weight code and $C_1$ the [4, 1, 4] repetition code $\{(0\ 0\ 0\ 0), (1\ 1\ 1\ 1)\}$. Then, the 16 codewords of the [8, 4, 4] obtained by applying Construction 2.2 to $C_0$ and $C_1$ are:

| | |
|---|---|
| (0 0 0 0 0 0 0 0) | (0 0 0 0 1 1 1 1) |
| (0 0 1 1 0 0 1 1) | (0 0 1 1 1 1 0 0) |
| (0 1 0 1 0 1 0 1) | (0 1 0 1 1 0 1 0) |
| (0 1 1 0 0 1 1 0) | (0 1 1 0 1 0 0 1) |
| (1 0 0 1 1 0 0 1) | (1 0 0 1 0 1 1 0) |
| (1 0 1 0 1 0 1 0) | (1 0 1 0 0 1 0 1) |
| (1 1 0 0 1 1 0 0) | (1 1 0 0 0 0 1 1) |
| (1 1 1 1 1 1 1 1) | (1 1 1 1 0 0 0 0) |

Hereinafter, this code will now be referenced as $H_3$, which is invariant under rotations of order 4. This fact can be verified by inspection in this simple case. For example, we can see that both (0 0 0 0 1 1 1 1) and (1 1 1 1 0 0 0 0) are in $H_3$. Notice that $H_3$ is an [8, 4, 4] extended Hamming code.

In a second example, a generalization of the first example can be provided by applying repeatedly Construction 2.2. Given $r \geq 3$ and a $[2^{r-1}, 2^{r-1}-r, 4]$ extended Hamming code $H_{r-1}$, consider a code $H_r$ of length $2^r$ and all possible $2^{2^r-r-1}$ codewords $c \in H_r$ of the form $c=(c_i, u \oplus c_i)$, where $c_i$ is a vector of length $2^{r-1}$ and even weight and $u \in H_{r-1}$. By Construction 2.2, $H_r$ is a $[2^r, 2^r-r-1, 4]$ extended Hamming code that is invariant under rotations of order $2^{r-1}$. For example, if $r=4$, applying Construction 2.2 to the [8, 7, 2] even weight code and the [8, 4, 4] extended Hamming code $H_3$ from the previous example, it is obtained a [16, 11, 4] extended Hamming code $H_4$ that is invariant under rotations of order 8.

In a third example, let n=32 and t=2. We take as $C_0$ a [16, 11, 4] extended Hamming code and as $C_1$ a [16, 5, 8] extended BCH code such that $C_1 \subseteq C_0$. The resulting $C_{2, 16}$ code from Construction 2.2 is a [32, 16, 8] code that is invariant under rotations of order 16. It should be noted that a regular extended BCH code of length 32 and minimum distance 8 has also dimension 16, so in this case it did not cost extra redundancy to have a code with the same parameters that in addition, is invariant under rotations of order 16.

In a fourth example, Reed-Solomon (RS) codes over non-binary fields GF ($2^m$) are considered. An extended RS code has length $2^m$. Take as $C_0$ a $[2^m, 2^m-3, 4]$ extended RS code and as $C_1$ a $[2^m, 2^m-7, 8]$ extended RS code such that $C_1 \subseteq C_0$. The resulting $C_{2, 2^m}$ code from Construction 2.2 is a $[2^{m+1}, 2^{m+1}-10, 8]$ code that is invariant under rotations of order $2^m$. The redundancy of this code exceeds in three the Singleton bound (codes meeting the Singleton bound, like RS codes, are called MDS). These three extra symbols may be regarded as the price paid to double the length of the code and to make it invariant under rotations of order $2^m$.

In a fifth example, let n=5 and t=4 in Construction 2.2. Take as $C_0$ the [5, 4, 2] even weight code and as $C_1$ the [5, 1, 4] code $\{(0, 0, 0, 0, 0), (1, 1, 1, 1, 0)\}$. The resulting code $C_{4,5}$ is a [20, 13, 4] code that is invariant under rotations of order 5.

A comparison to product codes now can be useful. Another way of obtaining a code of length tn that is invariant under rotations of order n and distance 2d is by using a t×n product code, in which each of the first t−1 rows of the code is encoded using an $[n, k_0, d]$ code, and the last row is the XOR of the first t−1 rows. The minimum distance of the product code is the product of the minimum distances of the horizontal and vertical codes: since the vertical code is the even weight code with distance 2, the product code has minimum distance 2d. When the symbols of the code are written row-wise, it is clear that the code is invariant under rotations of order n: a rotation of order n corresponds to a vertical rotation of the rows in the code. Notice that the product code has dimension $(t-1)k_0$, while the code $C_{t,n}$ given by Construction 2.2 has dimension $(t-1)k0+k1$, clearly improving the product code. It should be pointed out that although the discussed construction was given for codes over fields of characteristic 2, that is, fields GF($2^m$) with $m \geq 1$, it can be routinely extended to any characteristic p, p a prime number.

After the above examples, now encoding and decoding algorithms as per one embodiment can be discussed. In one embodiment, the encoding algorithm can be described as follows:

Algorithm 3.1 (Encoding Algorithm) Consider $C_0$, $C_1$ and Ct,n as in Construction 2.2, and let the data vector be:

$$\underline{u}=(\underline{u}_0, \underline{u}_1, \ldots, \underline{u}_{t-1})$$

where $\underline{u}_i$ has length $k_0$ for $0 \leq i \leq t-2$ and $\underline{u}_{t-1}$ has length $k_1$. Then, $\underline{u}$ is encoded as $$\underline{c}=(\underline{c}_0, \underline{c}_1, \ldots, \underline{c}_{t-1})$$

where $\underline{c}_i$ is the encoding of $\underline{u}_i$ in $C_0$ for $0 \leq i \leq t-2$, and, if $\underline{v}_{t-1}$ is the encoding of $\underline{u}_{t-1}$ in $C_1$, then $\underline{c}_{t-1} = \underline{v}_{t-1} \oplus \oplus_{i=0}^{t-2} \underline{c}_i$.

The encoding algorithm is a direct consequence of Construction 2.2. Applying Encoding Algorithm 3.1 repeatedly, an efficient recursive method for encoding the extended Hamming code $H_r$ is obtained.

The subsequent algorithm is one that extends the Hamming code:

Algorithm 3.2 (Encoding Algorithm for the extended Hamming code $H_r$)—If $r=2$, then $H_2 = \{(0\ 0\ 0\ 0), (1\ 1\ 1\ 1)\}$ and x is encoded as $f_2(x) = (x\ x\ x\ x)$, where $x \in \{0, 1\}$. Assume $r > 2$. Let $\underline{u} = (u_0, u_1, \ldots, u_{2^{r-1}-2})$ and let $\underline{\hat{u}} = (u_0, u_1, \ldots, u_{2^{r-1}-2}, \oplus_{i=0}^{2^{r-1}-2} u_i)$. Then, $\underline{u}$ is encoded as $f_r(\underline{u}) = (\underline{\hat{u}}, \underline{\hat{u}} \oplus f_{r-1}(u_{2^{r-1}-1}, u_{r-1}, \ldots, u_{2^r - r - 2}))$.

Next an example of Encoding Algorithm 3.2 is provided. As in a previous example, consider the code $H_3$ and assume that the objective is to encode $(1\ 1\ 0\ 1)$. Now, using Algorithm 3.2, $(1\ 1\ 0\ 1)$ is encoded as:

$f_3(1,1,0,1) = (1,1,0,(1 \oplus 1 \oplus 0), (1,1,0,0) \oplus f_2(1)) = (1,1,0,0,0, 0,1,1)$.

Next a Decoding Algorithm is presented:

Algorithm 3.3 (Decoding Algorithm) Consider $C_0$, $C_1$ and $C_{t,n}$ as in Construction 2.2. Let $\underline{v} = (v_0, \underline{v}_1 \ldots \underline{v}_{t-1})$ be a received, possibly noisy version, of a codeword in Ct,n. Let $\underline{w} = (\underline{w}_0, \underline{w}_1, \ldots, \underline{w}_{t-1})$ be the vector obtained from decoding each $\underline{v}_i$ in $C_0$ for $0 \leq i \leq t-1$, where, if $\underline{v}_i$ is uncorrectable, we make $\underline{v}_i = \underline{w}_i$. Let $s_i = w_H(\underline{v}_i \oplus \underline{w}_i)$ if $\underline{v}_i$ is correctable, where $w_H$ denotes Hamming weight (i.e., $s_i$ gives the number of corrected errors) and $s_i = \lceil d/2 \rceil$ if $\underline{v}_i$ is uncorrectable. Then, the following steps are followed:

1. If $\Sigma_{i=0}^{t-1} s_i \geq d$, then declare an uncorrectable error.
2. Otherwise let $\underline{w}^T = \oplus_{i=0}^{t-1} \underline{w}_i$. If $\underline{w}^T \in C_1$, then decode $\underline{v}$ as $\underline{w}$. Otherwise, let $s_j = \max\{s_i, 0 \leq i \leq t-1\}$. If $s_j$ is not unique, declare an uncorrectable error. Otherwise, make $\underline{w}^T = \underline{w}^T \oplus \underline{w}_j \oplus \underline{v}_j$ (this step cancels the corrections to $\underline{v}_j$) and:
    (a) Decode $\underline{w}^T$ in $C_1$ as $\underline{c}^T$. If $\underline{w}^T$ is uncorrectable, then declare an uncorrectable error.
    (b) Otherwise, let $\underline{w}_j = \underline{c}^T \oplus \oplus_{t=0/t \neq 1}^{t-1} \underline{w}_1$ and decode $\underline{v}$ as $\underline{w}$.

It can be proven that, when Algorithm 3.3 is applied, code $C_{t,n}$ as given by Construction 2.2 can correct up to d−1 errors and detect d errors. Similarly it can be shown that if $w_H(v \oplus c) = d$, this situation will be detected by the algorithm and no incorrect decoding can occur. Decoding Algorithm 3.3 is particularly easy when $C_0$ is the even weight code and $C_1$ a code with minimum distance 4. In this case, if more than one of the received vectors $\underline{v}_i$ is found to be in error, then an uncorrectable error is declared. If there is an uncorrectable error in any of the $\underline{v}_i$ s, then an uncorrectable error is declared for the whole received vector $\underline{v}$.

Some applications for the above codes will be discussed next with the understanding that they are only for illustration, and these applications shall not be considered limiting in any case. One possible application can occur when assuming that a camera that can detect two halves of a pattern of length $2^r$ bits is being used, like an upper half and a lower half. However, due to rotations of the pattern (or of the camera), it is not possible to distinguish between the upper and the lower halves. At the same time, correction of up to one error and detection of two is desired. It can now be explained how such an application can be provided. In example 2, a scenario was provided where a $[2^r, 2^r-r-1, 4]$ was used with an extended Hamming code Hr that is invariant under rotations of order $2^{r-1}$. This property allows us to define an equivalence class in $H_r$ as follows: Given $\underline{c} = (c_L, c_R)$, where $c_L$ represents the first half of $\underline{c}$ and $c_R$ the second half, we say that $\underline{c} = (c_L, c_R)$, and $\underline{c}' = (c_R, c_L)$, are in the same equivalence class. The question of how many equivalence classes there are can be responded in the following manner. Each equivalence class consists of either one or two codewords: it consists of only one codeword if and only if $c_L = c_R$. An easy counting argument gives that there are exactly $2^{2^{r-1}-1}$ classes with only one codeword (the number of vectors of length $2^{r-1}$ and even weight). That leaves $2^{2^{r-1}-2}(2^{2^{r-1}-r}-1)$ classes with two codewords. This will provide a total of $2^{2^{r-1}-2}(2^{2^{r-1}-r}+1)$ classes, which is a number larger than $2^{2^r-r-2}$. What this means is that for every vector of length $2^r-r-2$, an equivalence class may be assigned so that when decoding a codeword $\underline{c} = (c_L, c_R)$ or $\underline{c}' = (c_R, c_L)$, the output will be a unique vector of length $2^r-r-2$. This means that the invariance property making a vector and its rotation $2^{r-1}$ times equivalent costs one extra bit.

For example, using $H_3$, since $r=3$, the number of equivalence classes is $2^{2^{r-1}-2}(2^{2^{r-1}-r}+1) = 12$. Explicitly, these classes are:

$C_0 = \{(0\ 0\ 0\ 0\ 0\ 0\ 0\ 0)\}$
$C_1 = \{(0\ 0\ 1\ 1\ 0\ 0\ 1\ 1)\}$
$C_2 = \{(0\ 1\ 0\ 1\ 0\ 1\ 0\ 1)\}$
$C_3 = \{(0\ 1\ 1\ 0\ 0\ 1\ 1\ 0)\}$
$C_4 = \{(1\ 0\ 0\ 1\ 1\ 0\ 0\ 1)\}$
$C_5 = \{(1\ 0\ 1\ 0\ 1\ 0\ 1\ 0)\}$
$C_6 = \{(1\ 1\ 0\ 0\ 1\ 1\ 0\ 0)\}$
$C_7 = \{(1\ 1\ 1\ 1\ 1\ 1\ 1\ 1)\}$
$C_8 = \{(0\ 0\ 0\ 0\ 1\ 1\ 1\ 1), (1\ 1\ 1\ 1\ 0\ 0\ 0\ 0)\}$
$C_9 = \{(0\ 0\ 1\ 1\ 1\ 1\ 0\ 0), (1\ 1\ 0\ 0\ 0\ 0\ 1\ 1)\}$
$C_{10} = \{(0\ 1\ 0\ 1\ 1\ 0\ 1\ 0), (1\ 0\ 1\ 0\ 0\ 1\ 0\ 1)\}$
$C_{11} = \{(0\ 1\ 1\ 0\ 1\ 0\ 0\ 1), (1\ 0\ 0\ 1\ 0\ 1\ 1\ 0)\}$

Example 5 can now be revisited such that a camera that cannot distinguish between vectors of length 20 that have been rotated 90 degrees is provided. In this case, it is needed to determine equivalence classes as done above such that $\underline{c} = (\underline{c}_0, \underline{c}_1, \underline{c}_2, \underline{c}_3)$ and $\underline{c}' = (\underline{c}_3, \underline{c}_0, \underline{c}_1, \underline{c}_2)$ are equivalent. Thus, each equivalence class has either one, two or four codewords. For example, a class with only one codeword is given by all the codewords $\underline{c} = (\underline{c}_0, \underline{c}_0, \underline{c}_0, \underline{c}_0)$. There are exactly $2^4 = 16$ such equivalence classes. Another class is given by codewords of the form $\underline{c} = (\underline{c}_0, \underline{c}_1, \underline{c}_0, \underline{c}_1)$ with $\underline{c}_0 \neq \underline{c}_1$. There are exactly $2^8 - 2^4 = 108$ such codewords, giving 120 different equivalence classes.

The remaining $2^{13} - 2^8 = 7936$ codewords form equivalence classes with four codewords each. Thus, there are 1984 such equivalence classes. If we use these 1984 classes only we can, in addition, identify the rotation angle. In any case, the total number of classes is $16 + 120 + 1984 = 2120 > 2048 = 2^{11}$. Thus, a data vector of length 11 is uniquely associated to an equivalence class, and such data vector will be successfully retrieved even in the presence of an error and a 5-bit shift (and thus also a 10 and a 15-bit shift) in the 20-bit encoded vector. The encoding of a 13-bit data vector $\underline{u} = (u_0, u_1, \ldots, u_{12})$ into a 20-bit vector $\underline{c} = (c_0, c_1, \ldots, c_{19})$, is given by $$c_i = u_i \text{ for } 0 \leq i \leq 3$$

$$c_4 = \bigoplus_{i=0}^{3} u_i$$

$$c_i = u_{i-1} \text{ for } 5 \leq i \leq 8$$

$$c_9 = \bigoplus_{i=4}^{7} u_i$$

-continued $c_i = u_{i-2}$ for $10 \leq i \leq 13$ $c_{14} = \bigoplus_{i=8}^{11} u_i$ $c_i = u_{12} \oplus c_{i-15} \oplus c_{i-10} \oplus c_{i-5}$ for $15 \leq i \leq 18$ $c_{19} = c_4 \oplus c_9 \oplus c_{14}$ For example,
$\underline{u}=(1, 1, 0, 1, 0, 1, 1, 0, 1, 1, 1, 1, 1)$
is encoded as
$\underline{c}=(1, 1, 0, 1, 1, 0, 1, 1, 0, 0, 1, 1, 1, 1, 0, 1, 0, 1, 1, 1)$ The decoding is started by assuming that v is a received vector. In this case, $\underline{v}$ can be divided into four vectors of length 5, i.e., $\underline{v}=(\underline{v0}, \underline{v1}, \underline{v2}, \underline{v3})$. If at least two of these four vectors have odd weight, this means that at least two errors have occurred and an uncorrectable error is declared. If there is only one vector of odd weight, say, block i, $0 \leq i \leq 3$, the decoder assumes that there is only one error in block i, so the next step is identifying its location. To this end $\underline{x}=\bigoplus_{i=0}^{3} \underline{vi}$ is computed. It is assumed that $\underline{x}=(x0, x1, x2, x3, x4)$ such that if x4=1 and the first 4 bits of $\underline{x}$ have weight 0 or 4, we conclude that the error is in the last bit of vector i, while if x4=1 and the first 4 bits of $\underline{x}$ have weight 1, 2 or 3, then an uncorrectable error is declared. If x4=0 and the first 4 bits of $\underline{x}$ have weight 2, then an uncorrectable error is also declared. Similarly, if the first 4 bits of $\underline{x}$ have weight 1, identify the location j, $0 \leq j \leq 3$, where xj=1 then it is concluded that the error is in location j of vector $\underline{vi}$. Similarly, if the first 4 bits of x have weight 3, identifying the location j, $0 \leq j \leq 3$, where xj=0 leads to concluding that the error is in location j of vector $\underline{vi}$.

Once the error is corrected, the 13 data bits can be retrieved by reversing the encoding steps. If the four vectors $\underline{vi}$, $0 \leq i \leq 3$, have even weight, then compute $\underline{x}=\bigoplus_{i=0}^{3} \underline{vi}=(x0, x1, x2, x3, x4)$. If x4=1 or the first four bits of $\underline{x}$ have weight 2, then an uncorrectable error is declared. For example, let $\underline{v}=(1, 1, 0, 1, 1, 0, 1, 1, 1, 0, 1, 1, 1, 1, 0, 1, 0, 1, 1, 1)$. It is easy to see that the second block has odd weight, so that the error has occurred in that block. By XORing the four vectors of length 5, $\underline{x}=(1, 1, 1, 0, 0)$ is obtained and a conclusion reached that the error has occurred in the fourth location of the second block. The correction is then made to achieve: $\underline{c}=(1, 1, 0, 1, 1, 0, 1, 1, 0, 0, 1, 1, 1, 1, 0, 1, 0, 1, 1, 1)$. Moreover, since the recomputed value of $\underline{x}$ is (1, 1, 1, 1, 0), the 13 data bits are given by u=(1, 1, 0, 1, 0, 1, 1, 0, 1, 1, 1, 1, 1).

Figure 2:
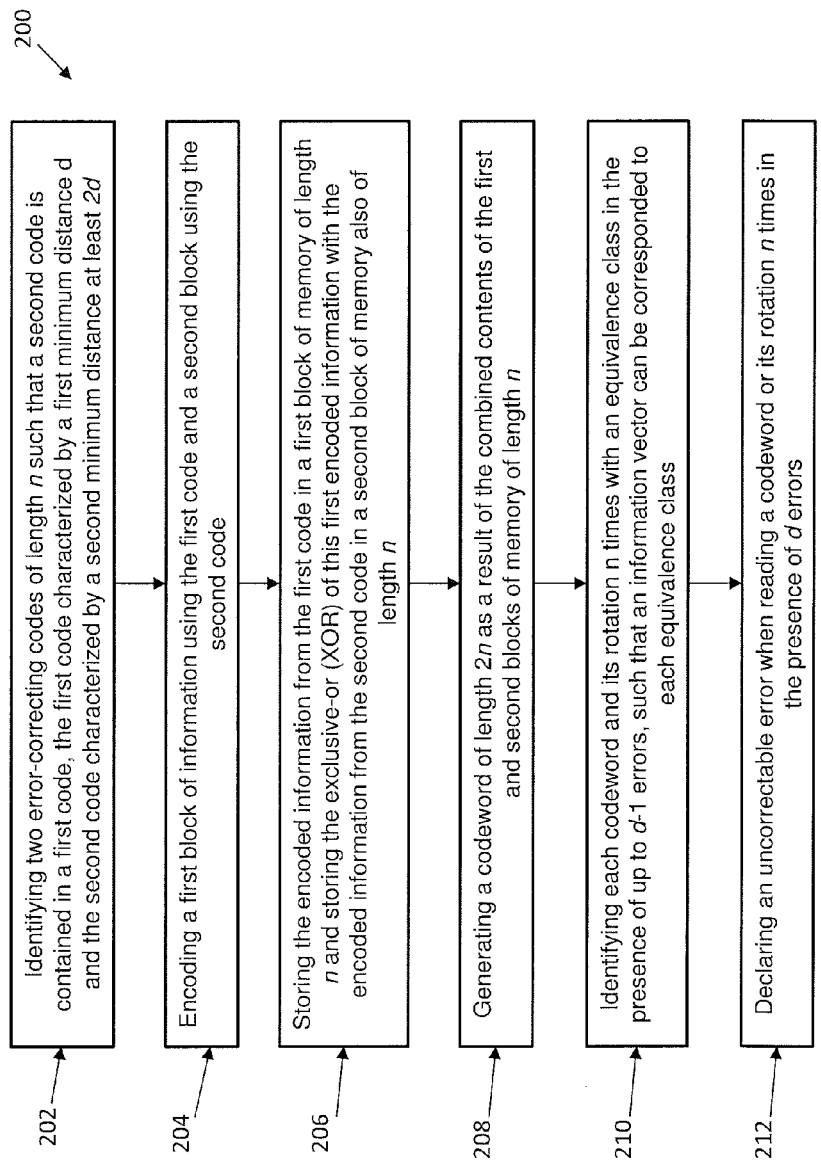
FIG. 2 depicts a flow chart diagram of an exemplary method 200 of data encoding using a computer is shown.

Referring now to FIG. 2, a flow chart diagram of an exemplary method 200 of data encoding using a computer is shown. As illustrated at block 202, the method 200 includes identifying two error-correcting codes of length n such that a second code is contained in a first code, the first code characterized by a first minimum distance d and the second code characterized by a second minimum distance at least 2d. Next, the method 200 includes encoding a first block of information using the first code and a second block using the second code, as shown at block 204. As illustrated at block 206, the method 200 also includes storing the encoded information from the first code in a first block of memory of length n and storing the exclusive-or (XOR) of this first encoded information with the encoded information from the second code in a second block of memory also of length n. Next, the method 200 includes generating a codeword of length 2n as a result of the combined contents of the first and second blocks of memory of length n, as shown at block 208.

As illustrated at block 210, the method 200 further includes identifying each codeword and its rotation n times with an equivalence class in the presence of up to d−1 errors, such that an information vector can be corresponded to each equivalence class. As illustrated at block 210, the method concludes by declaring an uncorrectable error when reading a codeword or its rotation n times in the presence of d errors.

Figure 3:
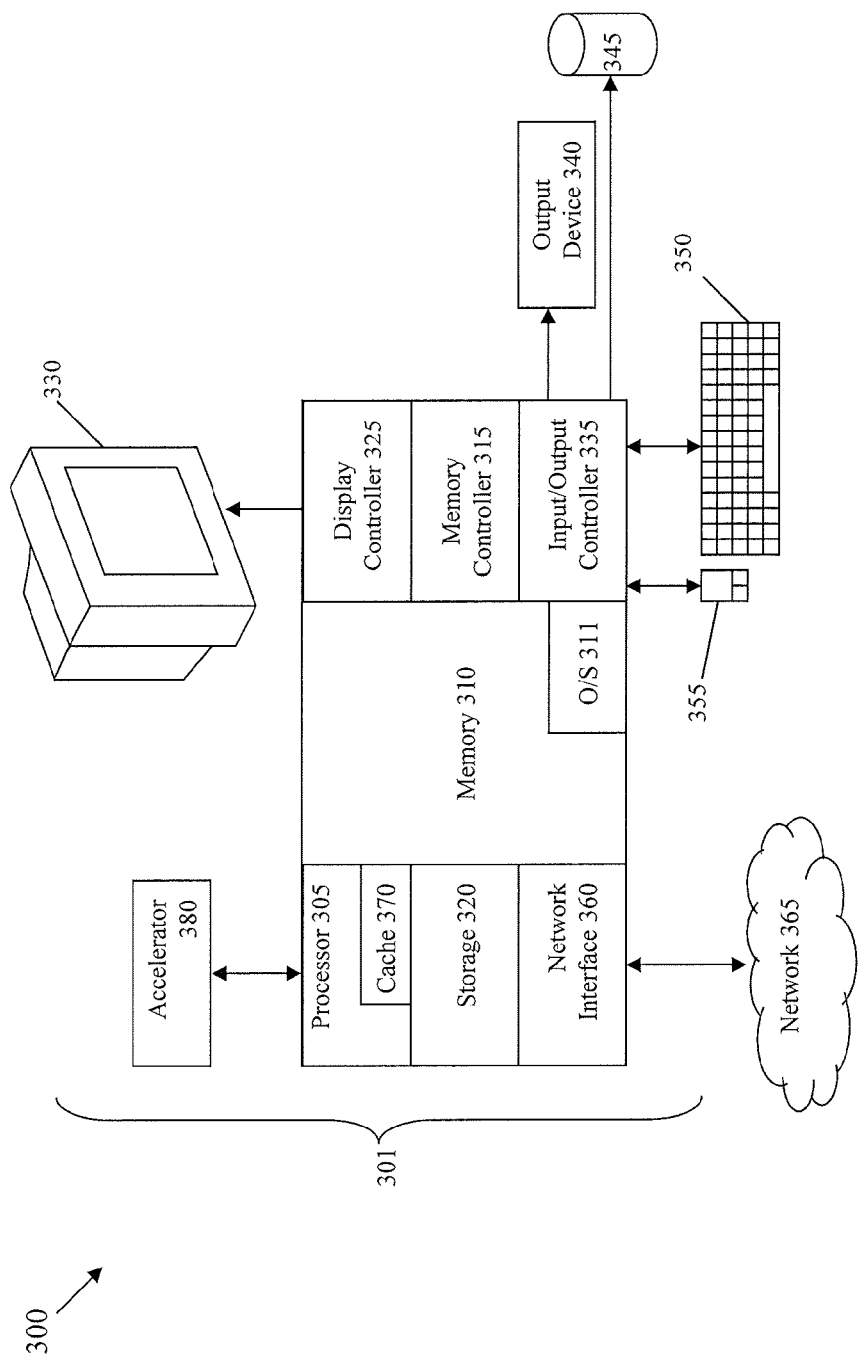
FIG. 3 depicts a block diagram of a computer system for practicing the teachings herein according to an embodiment.

Referring now to FIG. 3, a block diagram of an exemplary computer system 300 for use with the teachings herein is shown. The methods described herein can be implemented in hardware software (e.g., firmware), or a combination thereof. In an exemplary embodiment, the methods described herein are implemented in hardware, and is part of the microprocessor of a special or general-purpose digital computer, such as a personal computer, workstation, minicomputer, or mainframe computer. The system 300 therefore includes general-purpose computer 301.

In an exemplary embodiment, in terms of hardware architecture, as shown in FIG. 3, the computer 301 includes a processor 305, memory 310 coupled via a memory controller 335, a storage device 320, and one or more input and/or output (I/O) devices 340, 345 (or peripherals) that are communicatively coupled via a local input/output controller 335. The input/output controller 335 can be, for example, but not limited to, one or more buses or other wired or wireless connections, as is known in the art. The input/output controller 335 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The storage device 320 may include one or more hard disk drives (HDDs), solid state drives (SSDs), or any other suitable form of storage.

The processor 305 is a computing device for executing hardware instructions or software, particularly that stored in memory 310. The processor 305 can be any custom made or commercially available processor, a central processing unit (CPU), an auxiliary processor among several processors associated with the computer 301, a semiconductor based microprocessor (in the form of a microchip or chip set), a macroprocessor, or generally any device for executing instructions. The processor 305 may include a cache 370, which may be organized as a hierarchy of more cache levels (L1, L2, etc.).

The memory 310 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 310 may incorporate electronic, magnetic, optical, and/or other types of storage media. Note that the memory 310 can have a distributed architecture, where various components are situated remote from one another, but can be accessed by the processor 305.

The instructions in memory 310 may include one or more separate programs, each of which comprises an ordered listing of executable instructions for implementing logical functions. In the example of FIG. 3, the instructions in the memory 310 include a suitable operating system (OS) 311. The operating system 311 essentially controls the execution of other computer programs and provides scheduling, input-output control, file and data management, memory management, and communication control and related services.

In an exemplary embodiment, a conventional keyboard 350 and mouse 355 can be coupled to the input/output controller 335. Other output devices such as the I/O devices 340, 345 may include input devices, for example but not limited to a printer, a scanner, microphone, and the like. Finally, the I/O devices 340, 345 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 300 can further include a display controller 325 coupled to a display 330. In an exemplary embodiment, the system 300 can further include a network interface 360 for coupling to a network 365. The network 365 can be an IP-based network for communication between the computer 301 and any external server, client and the like via a broadband connection. The network 365 transmits and receives data between the computer 301 and external systems. In an exemplary embodiment, network 365 can be a managed IP network administered by a service provider. The network 365 may be implemented in a wireless fashion, e.g., using wireless protocols and technologies, such as Wi-Fi, WiMax, etc. The network 365 can also be a packet-switched network such as a local area network, wide area network, metropolitan area network, Internet network, or other similar type of network environment. The network 365 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 301 is a PC, workstation, intelligent device or the like, the instructions in the memory 310 may further include a basic input output system (BIOS) (omitted for simplicity). The BIOS is a set of essential routines that initialize and test hardware at startup, start the OS 311, and support the transfer of data among the storage devices. The BIOS is stored in ROM so that the BIOS can be executed when the computer 301 is activated.

When the computer 301 is in operation, the processor 305 is configured to execute instructions stored within the memory 310, to communicate data to and from the memory 310, and to generally control operations of the computer 301 pursuant to the instructions. In exemplary embodiments, the computer system 300 includes one or more accelerators 380 that are configured to communicate with the processor 305. The accelerator 380 may be a field programmable gate array (FPGA) or other suitable device that is configured to perform specific processing tasks. In exemplary embodiments, the computer system 300 may be configured to offload certain processing tasks to an accelerator 380 because the accelerator 380 can perform the processing tasks more efficiently than the processor 305.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Further, as will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and software.

Noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and software.

What is claimed is:

1. A method of data encoding using a computer, comprising:
   identifying two error-correcting codes of length n such that a second code is contained in a first code, the first code characterized by a first minimum distance d and the second code characterized by a second minimum distance at least 2d;
   encoding a first block of information using the first code and a second block of information using the second code;
   storing the encoded information from the first code in a first block of memory of length n and storing an exclusive-or (XOR) of the encoded information from the first code with the encoded information from the second code in a second block of memory also of length n;
   generating a codeword of length 2n as a result of the combined contents of the first and second blocks of memory of length n;
   identifying each codeword and its rotation n times with an equivalence class in the presence of up to d−1 errors, such that an information vector can be corresponded to each equivalence class; and
   declaring an uncorrectable error when reading a codeword or its rotation n times in the presence of d errors.

2. The method of claim 1, further comprising reading the information vector, wherein reading the information vector includes rotating a relative perspective by 180 degrees with respect to the information vector.

3. The method of claim 1, further comprising reading the information vector, wherein reading the information vector includes rotating a relative perspective by 90 degrees with respect to the information vector.

4. The method of claim 1, wherein the first code is an even weight code.

5. The method of claim 1, wherein the second code is an extended Hamming code.

6. A method of identifying a vector that can be read via a particular rotation using codes of length tn invariant under rotations of order n, comprising:
   identifying a first and a second error-correcting code of length n each, wherein the first code has minimum distance d, the second code has minimum distance at least 2d and the second code is contained in the first code;
   encoding t−1 blocks of information into t−1 codewords using the first code and encoding a t-th block of information into a codeword using the second code;
   storing the t−1 codewords from the first code into t−1 blocks of memory of length n each and storing an exclusive-or (XOR) of these t−1 codewords with the t-th codeword from the second code into a t-th block of memory also of length n; and generating a codeword of length tn as a result of the combined contents of the first t−1 and t-th blocks of memory of length n.

7. The method of claim 6, further comprising: identifying each codeword and its rotations jn times, where $1 \leq j \leq t-1$.

8. The method of claim 7, wherein each codeword and its rotations jn times are identified as belonging in the same equivalence class.

9. The method of claim 7, wherein up to d−1 errors can be corrected and d errors can be detected when reading a codeword or its rotation jn times, where $1 \leq j \leq t-1$.

10. The method of claim 6, further comprising applying a relative rotation of (360 j)/t degrees to read the encoded vector, where $0 \leq j \leq t-1$.

11. The method of claim 6, wherein the first t−1 blocks are encoded using an even weight code and the t-th block is encoded using an extended Hamming code.

12. A non-transitory computer readable storage medium having contents that, when executed, cause a processor to:

identify a first and a second error-correcting code of length n each, wherein the first code has minimum distance d, the second code has minimum distance at least 2d and the second code is contained in the first code;

encode t−1 blocks of information into t−1 codewords using the first code and encode a t-th block of information into a codeword using the second code;

store the t−1 codewords from the first code into t−1 blocks of memory of length n each and storing an exclusive-or (XOR) of these t−1 codewords with the t-th codeword from the second code into a t-th block of memory also of length n; and generate a codeword of length tn as a result of the combined contents of the first t−1 and t-th blocks of memory of length n.

13. The non-transitory computer readable medium of claim 12, wherein the contents further cause the processor to identify each codeword and its rotations jn times, where $1 \leq j < t-1$.

14. The non-transitory computer readable medium of claim 13, wherein each codeword and its rotations jn times are identified as belonging in the same equivalence class.

15. The non-transitory computer readable medium of claim 13, wherein up to d−1 errors can be corrected and d errors can be detected when reading a codeword or its rotation jn times, where $1 \leq j \leq t-1$.

16. The non-transitory computer readable medium of claim 12, wherein the contents further cause the processor to read an encoded vector by applying a relative rotation of (360 j)/t degrees, where $0 \leq j \leq t-1$.

17. The non-transitory computer readable medium of claim 12, wherein the first t−1 blocks are encoded using an even weight code and the t-th block is encoded using an extended Hamming code.

\* \* \* \* \*